United States Patent [19]

Masuda

[11] 4,387,449
[45] Jun. 7, 1983

[54] PROGRAMMABLE MEMORY DEVICE HAVING REDUCED POWER CONSUMPTION UPON UNSELECTION

[75] Inventor: Hajime Masuda, Tokyo, Japan

[73] Assignee: Nippon Electric Co., Ltd., Tokyo, Japan

[21] Appl. No.: 205,547

[22] Filed: Nov. 10, 1980

[30] Foreign Application Priority Data

Nov. 8, 1979 [JP] Japan .................................. 54-144692

[51] Int. Cl.³ .............................................. G11C 7/00
[52] U.S. Cl. ................................................... 365/227
[58] Field of Search ................. 365/226, 227, 228, 229

[56] References Cited

FOREIGN PATENT DOCUMENTS 54-128231 10/1979 Japan ..................................... 365/227

Primary Examiner—Joseph A. Popek
Attorney, Agent, or Firm—Sughrue, Mion, Zinn, Macpeak & Seas

[57] ABSTRACT

A memory device is capable of operating in a power down mode in which peripheral memory circuitry is inactivated, the power down mode being assumed in response to an unselect signal at any one of a plurality of chip enable terminals. In response to a write potential at the output terminal of the memory, a detector circuit will leave the output circuit inactivated but will activate any peripheral circuitry necessary for the write operation.

10 Claims, 8 Drawing Figures

PROGRAMMABLE MEMORY DEVICE HAVING REDUCED POWER CONSUMPTION UPON UNSELECTION

BACKGROUND OF THE INVENTION

The present invention relates to an electrically programmable memory device, and more particularly to a memory device having a function for reducing power consumption upon unselection.

Various types of the electrically programmable memory devices, that is, programmable read-only memories (hereinafter abbreviated as P-ROM's), have been proposed, among them a fuse type P-ROM using a michrome line as a semi-permanent memory element (memory cell) and a junction type P-ROM using an open-base transistor as a semi-permanent memory element (memory cell).

A plurality of P-ROM's are usually used in one system such as a computer, where they are interconnected through a common data bus for the purpose of storing a necessary amount of information. Consequently, in order to read out desired information, it is necessary to make provision such that only the P-ROM storing the desired information should be selectively activated and the other P-ROM's should be inactivated so as to prevent read-out of undesired information. The selection of the desired P-ROM is performed by an external controller, and the function of inhibiting the undesired information from being output is possessed by the P-ROM itself. More particularly, a P-ROM is selected by application of a chip-enable signal from a controller, and for that purpose an output circuit is included in the P-ROM and activated by a chip-enable circuit to feed the information at the address designated by an address signal to a data bus. On the other hand, in the remaining P-ROM's which are not selected as a result of application of an unselection signal, an output level of the chip-enable circuit inactivates the output circuit, and hence output of information is inhibited.

Besides the above-described memory cell group and output circuit, the P-ROM comprises peripheral circuits such as an address circuit for receiving an address signal, a decoder for decoding the output of the address circuit to designate an addressed memory cell, and the like. Thus in an unselected P-ROM, though the output circuit is inactivated, the peripheral circuits are kept activated. Hence, the power consumption in the unselected P-ROM's is increased as the memory capacity of the device is enlarged. Consequently, in recent days a P-ROM having the so-called power-down mode has been proposed in which upon unselection not only an output circuit but also peripheral circuits are entirely or partly inactivated to reduce power consumption to less than one-half of that upon selection. More particularly, each P-ROM is provided with a power supply control circuit which inhibits power supply to the peripheral circuits when it is actuated, and this power supply control circuit is actuated upon unselection of the P-ROM. Consequently, when an unselection signal is applied to the P-ROM, simultaneously with inactivation of the output circuit, power supply from the power supply control circuit to the peripheral circuits is inhibited, so that power consumption of an unselected P-ROM can be greatly reduced.

However, although there occurs no problem in the case where a signal input terminal for activating the power supply control circuit and a chip-enable terminal for controlling activation and inactivation of an output circuit are separately provided, in the case where these terminals are provided in common there is a serious shortcoming that writing of data into the P-ROM is impossible. More particularly, a terminal for writing data into the P-ROM is normally provided in common with an output terminal in order to reduce the of a number of terminals. The output terminal is connected to a collector final stage transistor in the output circuit, and its base is furnished with information from a memory cell and is also connected to the chip-enable terminal. Accordingly, if writing of data is effected while the chip-enable terminal is maintained at a selection level, that is, while the output circuit is kept activated, then, due to the fact that the final stage transistor in the output circuit will be conducting in response to the application of a signal from a memory cell, all the writing electric power flows into the output circuit without being supplied to the memory cell, resulting in that the writing of data cannot be achieved. Therefore, upon writing of data, the output circuit must necessarily be inactivated. As described previously, inactivation of an output circuit as well as the power-down mode of the P-ROM must be achieved at the same time in order to reduce power consumption during the unselecting period. Accordingly, in the case where the signal terminal for power-down and the chip-enable terminal are provided in common, in response to application of an unselection signal level to the chip-enable terminal for inactivating the output circuit, the power supply control circuit is simultaneously actuated with the result that the peripheral circuits are also inactivated. As described above, in order to perform the writing of data it is necessary to inactivate the output circuit. This means that an unselection signal level is applied to a chip-enable terminal, so that the peripheral circuits are also inactivated simultaneously. Consequently, the writing of data would become impossible because the peripheral circuits are also inactivated simultaneously with inactivation of the output circuit.

Thus, in the conventional P-ROM, if the activation and inactivation of the output circuit as well as the power-down mode are controlled by a single common terminal, it would be impossible to write data. In other words, to realize a power-down mode of the conventional P-ROM upon unselection, a terminal for a power-down mode must be provided separately from the terminals necessitated for read-out of a program and selection of a chip. For this reason, the package of the conventional P-ROM having a power-down mode becomes large and its cost is increased.

SUMMARY OF THE INVENTION

It is, therefore, a major object of the present invention to provide a memory device in which a chip-enable terminal for controlling activation and inactivation of an output circuit and a terminal for a power-down mode are provided in common.

Another object of the present invention is to provide a memory device in which a power-down mode can be achieved through a single chip-enable terminal.

Still another object of the present invention is to provide a memory device in which a chip selection function as well as a power-down mode function are provided and writing is performed with a minimum number of terminals.

According to one feature of the present invention, there is provided a memory device comprising a group of electrically programmable memory elements, a selection circuit for selecting a memory element to write information in and to read information out of the memory element group, an output circuit for reading out information from the memory element group, a control circuit for inactivating the output circuit and the selection circuit, an output terminal coupled to the output circuit, a detecting means coupled to the output terminal for detecting an electric power supplied to the output terminal for programming the memory element group, and means responsive to the output of the detecting means for activating the selection circuit while keeping the output circuit inactivated.

In the memory device according to the present invention, peripheral circuits are inactivated simultaneously with inactivation of an output circuit, resulting in a power-down mode, and hence power consumption upon unselection can be greatly reduced. Moreover, in response to writing after the inactivation of an output circuit, peripheral circuits necessary for writing are activated to enable writing in a desired memory element, and then a programming current is fed to the memory element group.

BRIEF DESCRIPTION OF THE DRAWINGS

These and other objects, features and advantages of the present invention will become more apparent from the following detailed description taken in conjunction with the accompanying drawings, wherein.

DETAILED DESCRIPTION OF THE PRIOR ART

Figure 1:
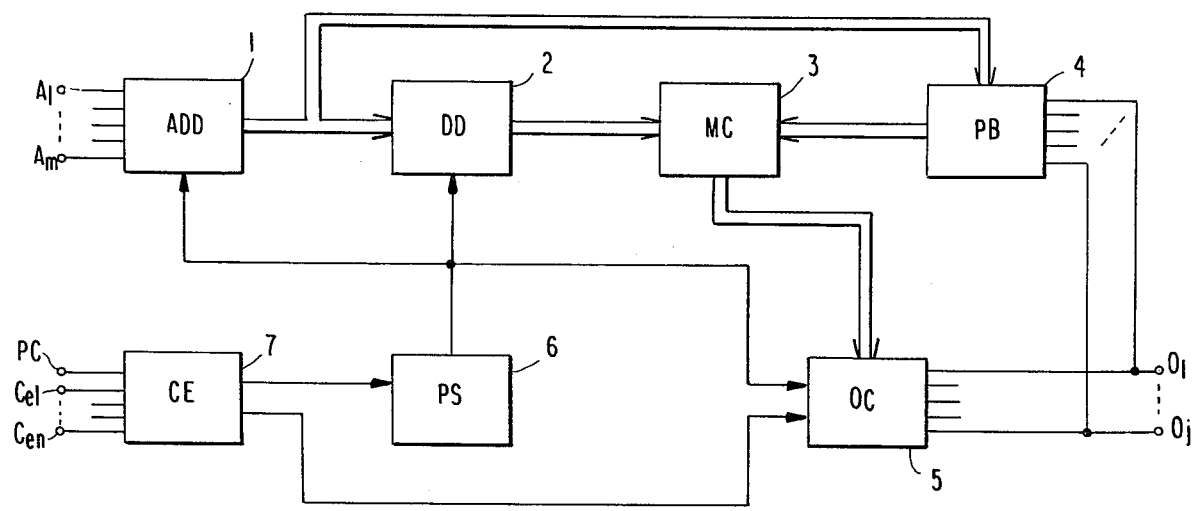
FIG. 1 is a block diagram of a P-ROM according to the prior art having a power-down mode.

A heretofore known P-ROM having a power-down mode illustrated in FIG. 1 is composed of a memory cell group (MC) 3, an address circuit (ADD) 1 and a decoder-driver (DD) 2 for designating a predetermined memory element (memory cell) in the MC 3 in response to an address signal applied to address terminals $A_1-A_m$, a program-buffer circuit (PB) 4 for writing in the MC 3, an output circuit (OC) 5 for outputting information stored in the MC 3 though output terminals $O_1-O_j$, a chip-enable circuit (CE) 7 for controlling activation and inactivaton of the OC 5 in accordance with signal levels applied to chip-enable terminals $Ce_1-Ce_n$ and also controlling a power supply control circuit 6 as referred to below in response to a signal applied to a power-down mode control terminal PC, and a power supply control circuit (PS) 6 responsive to an output level from the CE 7 for controlling the power supply to the ADD 1, DD 2 and OC 5.

In the above-described circuit construction, if chip-enable signals having a selection level are applied to the chip-enable terminals $Ce_1-Ce_n$ and also a signal having a signal level adapted to activate the PS 6 is applied to the power-down mode control terminal PC, then the CE 7 activates the OC 5 and also enables the PS 6 to supply electric power to the ADD 1, DD 2 and OC 5. Consequently, the predetermined memory cell in the MC 3 is designated by the address signal applied to the address terminals $A_1-A_m$, and the informaton stored in the designated memory cell is output at the output terminals $O_1-O_j$ through the OC 5. On the other hand, if chip-enable signals having an unselection level are applied to the terminals $Ce_1-Ce_n$, then the OC 5 is inactivated, and thereby the output of the information stored in the MC 3 is inhibited. At this moment, if a signal for inactivating the PS 6 is also applied to the terminal PC, then the power supply from the PS 6 to the ADD 1, DD 2 and OC 5 is inhibited, and hence a power-down mode is realized.

The above-mentioned operations will be described in more detail with reference to FIG. 2, in which detailed circuit constructions of the OC 5, PS 6, CE 7 and MC 3 are illustrated. In the CE 7, circuit portions to be connected to the terminals $Ce_2-Ce_n$ are omitted because each of them is identical to the illustrated circuit portion connected to the terminal $Ce_1$. Furthermore, in this figure, only a program-buffer circuit portion 4', memory cell group portion 3' and output circuit portion 5' to be associated with the output terminal $O_1$ are illustrated, and the corresponding circuit portions to be coupled to the remaining output terminals $O_2-O_j$ are omitted because they are identical to the illustrated circuit portions to be coupled to the output terminal $O_1$.

Figure 2:
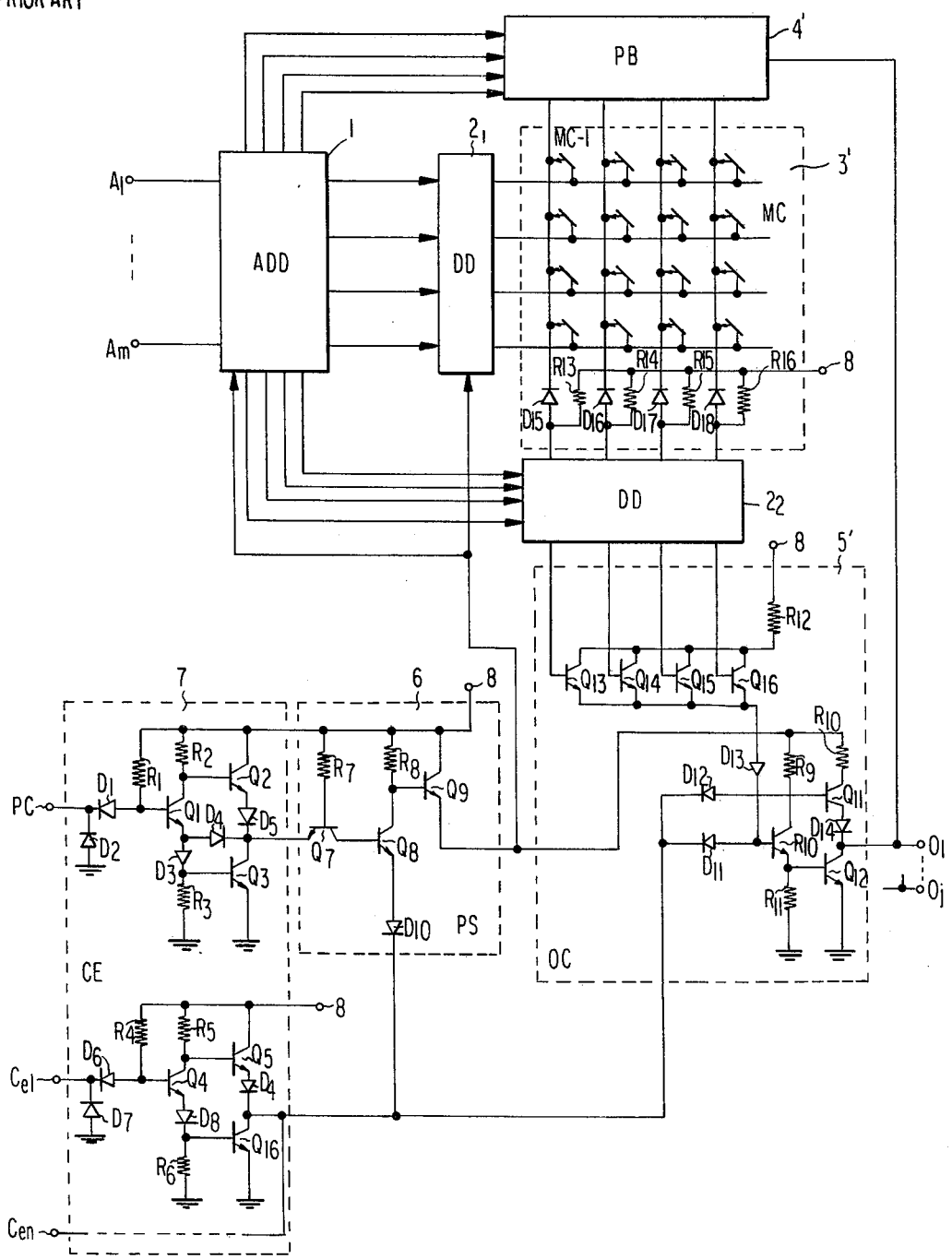
FIG. 2 is a wiring diagram showing a detailed circuit construction of some blocks in FIG. 1.

In FIG. 2, the power-down mode control terminal PC is connected via a diode $D_1$ to a base of a transistor $Q_1$ and is also grounded via a diode $D_2$. The collector of the transistor $Q_1$ is connected through a resistor $R_2$ to a power supply terminal 8, and is also connected to the base of a transistor $Q_2$. The base of the transistor $Q_1$ is connected through a resistor $R_1$ to the power supply terminal 8, and its emitter is grounded through a diode $D_3$ and a resistor $R_3$ and is also connected through a diode $D_4$ to the collector of a transistor $Q_3$. To the collector of the transistor $Q_3$ is connected the emitter of the transistor $Q_2$ through a diode $D_5$, and the base and emitter of the transistor $Q_3$ are respectively connected to either end of the resistor $R_3$. The collector of the transistor $Q_2$ is connected to the power supply terminal 8.

Each of the chip-enable terminals $Ce_1-Ce_n$ is connected via the diode $D_6$ to a base of a transistor $Q_4$ and is also grounded via a diode $D_7$. The base and collector of the transistor $Q_4$ are respectively connected through resistors $R_4$ and $R_5$ to the power supply terminal 8, and its emitter is grounded through a diode $D_8$ and a resistor $R_6$. A transistor $Q_5$ has its base connected to the collector of the transistor $Q_4$, its collector connected to the power supply terminal 8, and its emitter connected via a diode $D_9$ to the collector of the transistor $Q_6$. The base and emitter of the transistor $Q_6$ are respectively connected to either end of the resistor $R_6$.

The CE 7 is constructed of the above-described circuit arrangement, and from the collectors of the transistors $Q_3$ and $Q_6$ are derived outputs, one of which is applied to the PS 6 and the other of which is applied to the OC 5'. In other words, the collector output of the transistor $Q_3$ controls the PS 6, while the collector output of the transistor $Q_6$ controls the activation and inactivation of the OC 5'.

The output from the transistor $Q_3$ is received by the emitter of a transistor $Q_7$ within the PS 6, and the base of the transistor $Q_7$ is connected through a resistor $R_7$ to the power supply terminal 8. The collector of the transistor $Q_7$ is connected to the base of a transistor $Q_8$. The collector of the transistor $Q_8$ is connected via a resistor $R_8$ to the power supply terminal 8, and its emitter is connected via a diode $D_{10}$ to the collector of the transistor $Q_6$ forming the other output of the CE 7. The collector and base of a transistor $Q_9$ are respectively connected to either end of the resistor $R_8$, and an output of the PS 6 is derived from the emitter of the transistor $Q_9$. The output of the PS 6 is fed to the OC 5' (or another similar circuit) and is also applied to the ADD 1 and a decoder-driver circuit $2_1$ for selecting row lines of the MC 3. It should be noted that the other decoder-driver circuit $2_2$ for selecting column lines of the MC 3 normally has a diode matrix construction which selects only one column line in response to a combination of signals fed from the ADD 1, and hence the output from the PS 6 is not applied to this decoder-driver circuit $2_2$.

The output from the CE 7 for controlling the activation and inactivation of the OC 5', that is, the collector output from the transistor $Q_6$, is supplied via a diode $D_{11}$ to the base of a transistor $Q_{10}$ and is also supplied via a diode $D_{12}$ to the collector of the transistor $Q_{10}$ and to the base of a transistor $Q_{11}$ in the OC 5'. To the collectors of the transistors $Q_{10}$ and $Q_{11}$ is applied the output of the PS 6 through resistors $R_9$ and $R_{11}$, respectively. The emitter of the transistor $Q_{10}$ is grounded through a resistor $R_{10}$ and is also grounded through the base-emitter path of a transistor $Q_{12}$. The emitter of the transistor $Q_{11}$ is connected via a diode $D_{14}$ to the collector of the transistor $D_{12}$, which is also connected to an output terminal $O_1$. To the base of the transistor $Q_{10}$ is applied via a diode $D_{13}$ an output of a transistor circuit consisting of transistors $Q_{13}$, $Q_{14}$, $Q_{15}$ and $Q_{16}$ whose collectors and emitters, respectively, are connected in common. To the bases of the transistors $Q_{13}$ to $Q_{16}$ are fed the information from the MC 3' through the DD $2_2$ for column selection, and the common junction of their collectors is connected through a resistor $R_{12}$ to the power supply terminal 8. The OC 5' and other equivalent OC's are composed of the above-described circuit arrangement.

On the other hand, selection of a desired memory cell in the MC 3' is performed in response to the address signal applied to the address terminals $A_1$-$A_m$. More particularly, in response to the applied address signal, only one row line and only one column line in the MC 3' are designated by the ADD 1 and DD $2_1$ for row and column selection, and consequently, a single open-base transistor having its collector and emitter respectively connected to the designated row and column ines is selected. As will be apparent from FIG. 2, open-base transistors are used for the memory elements constituting the MC 3'. To the respective column lines of the MC 3' are connected diodes $D_{15}$, $D_{16}$, $D_{17}$ and $D_{18}$ in series, and the power supply terminal 8 is respectively connected through resistors $R_{13}$, $R_{14}$, $R_{15}$ and $R_{16}$ to one end of each of these diodes so as to forwardly bias them.

In addition, to the respective column lines of the MC 3' is connected the PB 4' for writing data, and a current for the memorization is fed from the output terminal $O_1$ to the PB 4'. To the PB 4' is also applied an output from the ADD 1, and this output is used for column selection of the desired memory cell to be written. In other words, the PB 4' includes a decoder-driver circuit for column selection similar to the column selection DD $2_2$.

Assuming now that a chip selection level (a logic-0 level in such a prior art P-ROM, where the logic-0 represents low level, while a logic -1 high level) is applied to the chip-enable terminal Ce, then the diode $D_6$ is forward biased and hence the transistor $Q_4$ becomes non-conducting. Therefore, the transistor $Q_5$ becomes conducting and the transistor $Q_6$ becomes non-conducting, so that the collector output of the transistor $Q_6$ being the other output of the CE 7 takes the logic-1 level. When the collector output of the transistor $Q_6$ takes the logic-1 level, the diodes $D_{11}$ and $D_{12}$ within the OC 5' are reverse biased. At this moment, if the logic-0 level is applied to the power-down mode control terminal PC, then as will be readily seen by an analogy of the above-mentioned circuit portion connected to the chip-enable terminal Ce, the transistors $Q_1$ and $Q_3$ become non-conducting and the transistor $Q_2$ becomes conducting. Hence, the collector output from the transistor $Q_3$ takes the logic-1 level. Then, the emitter of the transistor $Q_7$ in the PS 6 also takes the logic-1 level, so that the transistor $Q_7$ becomes non-conducting. Although the transistor $Q_7$ is non-conducting, a base current tends to flow through the base-collector path of the transistor $Q_7$ to the base of the transistor $Q_8$. However, in this instance, since the collector output from the transistor $Q_6$ is also at the logic-1 level, the diode $D_{10}$ is reverse biased to prevent the base current to the transistor $Q_8$, so that a current cannot flow through the collector-emitter path of the transistor $Q_8$.

Consequently, the transistor $Q_9$ becomes conducting, so that the PS 6 can supply electric power to the transistors $Q_{10}$, $Q_{11}$ and $Q_{12}$ within the OC 5'. Furthermore, the PS 6 can also supply electric power to the ADD 1 and row selection DD $2_1$. Since the diodes $D_{11}$ and $D_{12}$ within the OC 5' are inactivated as described above, the transistor $Q_{10}$, $Q_{11}$ and $Q_{12}$ can output the information derived from the MC 3' through the transistors $Q_{13}$ to $Q_{16}$ to the output terminal $O_1$. In other words, the OC 5' has been activated.

On the contrary, in the case where the logic-1 level is applied to the power-down mode control terminal PC, the transistor $Q_3$ becomes conducting, so that the transistor $Q_7$ within the PS 6 also becomes conducting to tend to draw a current from the transistor $Q_8$. For this reason, the transistor $Q_8$ becomes non-conducting and the transistor $Q_9$ becomes conducting, so that the PS 6 can supply electric power to the OC 5', ADD 1 and row selection DD $2_1$. As will be apparent from the above description, provided that the signal at a selection level (the logic-0 level) is applied to the chip-enable terminal Ce, regardless of the signal level at the power-down mode control terminal PC, the output circuit 5' is activated and simultaneously the power supply to the peripheral circuits is also enabled, so that the memory device is brought into a read-out condition. Under such condition, when an address signal is applied to the address terminals $A_1$-$A_m$, then the predetermined row and column lines in the MC 3' are designated in accordance with the address signal, and thereby the transistor connected between the designated row and column lines is selected.

In the case of a junction type P-ROM, open-base transistors are used as memory elements, and the recognition of the information memorized in the memory element is performed in the following manner. That is, the emitter and collector of the open-base transistor are respectively connected to a column and a row line, and in each column line is inserted a diode $D_{15}$, $D_{16}$, $D_{17}$ or $D_{18}$ as shown in FIG. 2. When a memory element MC-1 connected to the uppermost row line and the leftmost column, for example, has been selected by address signals, a current fed from the power supply terminal 8 tends to flow through the resistor $R_{13}$ and the diode $D_{15}$ to the emitter of the memory element MC-1. At this moment, if the PN-junction between the emitter and base of the memory element MC-1 is present, the current is blocked by the PN-junction and so it cannot flow into the memory element MC-1. Therefore, the current is fed through the column selection DD $2_2$ to the base of the transistor $Q_{13}$ with the OC 5'. Then, the transistor $Q_{13}$ becomes conducting, so that the transistors $Q_{10}$ and $Q_{12}$ also become conducting with the result that the signal level at the output terminal $O_1$ takes the logic-0 level. On the other hand, if the PN-junction between the base and emitter of the memory element MC-1 has been destroyed and is not present, then the current fed from the power supply terminal 8 flows through the memory element MC-1 to the row selection DD $2_1$. Consequently, the transistor $Q_{13}$ becomes non-conductive, and hence the transistors $Q_{10}$ and $Q_{12}$ also become non-conductive. Then, the transistor $Q_{11}$ becomes conductive, resulting in that the output terminal $O_1$ takes the logic-1 level. As described above, depending upon the presence or absence of the PN-junction between the emitter and base of the each memory element in the MC 3', it is determined whether the output terminal $O_1$ is at the logic-0 level or at the logic-1 level.

Next, if the logic-1 level (that is, unselection level) has been applied to the chip-enable terminal $Ce_1$, then the diode $D_6$ is reverse biased, so that the transistors $Q_4$ and $Q_6$ become conductive owing to the current supply from the power supply terminal 8, and so the transistor $Q_5$ becomes non-conductive. As a result, the collector output from the transistor $Q_6$ takes the logic-0 level. Owing to the fact that this output of the logic-0 level is applied to the OC 5', the diodes $D_{11}$ and $D_{12}$ are forward biased, and hence the base potentials of the transistors $Q_{10}$ and $Q_{11}$ also become substantially equal to the ground level. Therefore, the OC 5' becomes inactivated. At this condition, if the logic-0 level is applied to the power-down mode control terminal PC, then the transistors $Q_1$ and $Q_3$ become non-conductive and the transistor $Q_2$ becomes conductive, as described previously. In this case, since the collector output from the transistor $Q_6$ which is a second output of the CE 7 is at a logic-0 level, although a current flow from the base of the transistor $Q_7$ to its emitter is not present, a current flows from the base of the transistor $Q_7$ through its collector to the base-emitter path of the transistor $Q_8$. As a result, the transistor $Q_8$ becomes conductive, and the transistor $Q_9$ becomes non-conductive. This means that the power supply from the PS 6 to the OC 5' and the peripheral circuits has been inhibited, and thus the power-down mode has been realized. On the contrary, if the logic-1 level has been applied to the power-down mode control terminal PC, then the transistors $Q_1$ and $Q_3$ become conductive and the transistor $Q_2$ becomes non-conductive. Thereby the transistor $Q_7$ becomes conductive, and hence reverse biases the transistor $Q_8$. Therefore, the transistor $Q_8$ becomes non-conductive and the transistor $Q_9$, becomes conductive. As a result, the power supply to the OC 5' and the peripheral circuits is made possible. In this case, although the power supply to the OC 5' is enabled, the base potentials of the transistors $Q_{10}$ and $Q_{11}$ are substantially at the ground level due to the collector output of the transistor $Q_6$ which is then at a logic-0 level, so that the OC 5' is kept inactivated.

From the above description, it will be readily seen that when the chip-enable terminal Ce is at the logic-1 level and the power-down mode control terminal PC is at the logic-0 level, a power-down mode upon unselection is realized, and that when both the terminals Ce and PC are at the logic-1 level, the OC 5' is inactivated but the peripheral circuits such as the ADD 1, row and column selection DD's $2_1$ and $2_2$ are activated.

It has been already described that the information stored in the respective memory elements within the MC 3' is recognized depending upon whether a base-emitter PN-junction of a designated memory element is present or not. Of course, the information in the MC 3 is determined by the program information to be programmed. The operation of either destroying or not destroying the base-emitter PN-junctions of the respective memory elements is carried out by externally passing a large current, called "programming current", through the desired memory element in accordance with the proggram information to be memorized. Now, the procedure of memorizing will be explained.

At first, a memory element to be programmed is designated by the ADD 1, row selection DD $2_1$ and PB 4' having a column selection decoder-driver in accordance with an address signal applied to the address terminals $A_1$–$A_m$. Next, if it is desired to write data in the designated memory element, then it is necessary to destroy the base-emitter PN-junction of that memory cell as described above, and therefore, a programming current consisting of a large current is made to flow into the designated memory element to destroy its PN-junction. In this instance, the programming current is not immediately passed through the memory element, but a relatively small current called "sense current" is at first supplied to the memory element for the purpose of recognizing if it has not yet been memorized. It is to be noted that in order to reduce the number of terminal, these sense current as well as programming currents are passed through the memory element from the output terminal $O_1$, and hence the PB 4 is connected to the output terminal $O_1$.

In response to the supply of the sense current, the so-called secondary breakdown would not arise but primary breakdown occurs at the base-emitter PN-junction of the selected memory element since the sense current has a small current value. Consequently, at the output terminal $O_1$ is obtained a voltage higher than the primary breakdown voltage. Since the primary breakdown voltage is set approximately at 8 V, a voltage higher than about 8 V appears at the output terminal $O_1$ by the supply of the sense current from it. If the voltage of about 8 V is obtained, the designated memory element is recognized to be in a non-programmed condition. If the voltage is not obtained, then the entire P-ROM including the designated memory element is determined to be defective.

Upon the above-described memorizing of a program, if the OC 5' is kept activated, then the current fed from the power supply terminal 8 in the MC 3 flows to the transistor $Q_{13}$, $Q_{14}$, $Q_{15}$ or $Q_{16}$ within the OC 5' since the emitter-base PN-junction of the selected memory element has not yet been destroyed. Then, the transistor $Q_{13}$, $Q_{14}$, $Q_{15}$ or $Q_{16}$ becomes conductive, and the transistors $Q_{10}$ and $Q_{12}$ also become conductive. Consequently, not only the sense current but also the programming current supplied from the output terminal $O_1$ would entirely flow through the transistor $Q_{12}$ to the ground, so that the voltage at the output terminal $O_1$ becomes substantially equal to the ground level. Consequently, not only the writing of a program in the P-ROM cannot be performed but also the P-ROM is determined to be defective. Accordingly, upon writing of the program, the OC 5' must necessarily be inactivated, and therefore, the signal level at the chip-enable terminal Ce must be at an unselection level, that is, at the logic-1 level. In this instance, if the power-down mode control terminal PC is held at the logic-0 level, then the peripheral circuits necessary for writing the program are also inactivated, so that the selection of the memory element to be memorized within the MC 3' cannot be performed with the result that the writing of a program is impossible. In other words, setting of the both signal levels at the terminals Ce and PC at the logic-1 level represents a programming enable condition. Accordingly, in order to perform programming, at first the signal at the logic-1 level must be applied to both the terminals Ce and PC.

By the supply of the sense current after such a condition being established and a desired memory element being selected, if the selected memory element is recognized to be in an non-memorization condition, then the large current serving as the programming current is supplied to the memory element to destroy its base-emitter PN-junction. Thereafter, in order to check if the programming has been correctly effected, a sense current is again passed through the memory element. If the PN-junction of the selected memory element has been duly destroyed, the voltage at the output terminal $O_1$ becomes lower than 6 V by the second supply of the sense current. Detecting this voltage, a pulse-shaped programming current is again supplied to the memory element to perfectly destroy its base-emitter PN-junction. The above-mentioned programming procedure is automatically carried out by means of a P-ROM writer.

As described above, if a P-ROM is provided with at least one chip-enable terminal Ce and a power-down mode control terminal PC, the power-down mode upon unselection can be achieved and also programming is possible. However, if both the terminals Ce and PC are formed as a common terminal for the purpose of reducing the number of terminals or if only a single terminal is available as a terminal for chip selection because of the increase of memory capacity, and if the P-ROM is constructed so as to realize a powerdown mode with the common terminal or the single terminal, then there arises a disadvantage that memorizing of a programming is entirely impossible.

More particularly, the power-down mode is to be achieved upon unselection of a P-ROM, and hence the PS 6 must be constructed in such manner that in response to the application of a signal at the logic-1 level serving as the unselection level to the chip-enable terminal Ce, the transistor $Q_9$ within the PS 6 may become non-conductive. On the other hand, upon programming, unless the OC 5' is kept inactivated, the transistors $Q_{10}$ and $Q_{12}$ would become conductive due to the current supply from the power supply terminal 8 within the MC 3' as described previously, so that memorization of a program would be impossible. Accordingly, if the unselection signal of the logic-1 level is applied to the chip-enable terminal Ce to inactivate the OC 5', then the PS 6 would be actuated by the application of the signal, so that the peripheral circuits such as the ADD 1, DD 2, etc. necessary for programming are also inactivated, resulting in that programming would become also impossible.

As will be seen from the above description, in the heretofore known P-ROM having the power-down mode upon unselection, besides address terminals $A_1-A_m$, output terminals $O_1-O_j$ and power suppy terminals, at least two additional terminals are necessitated. Therefore, in the case of manufacturing, for example, a P-ROM having an 8-bit output and a memory capacity of 64 K bits, the minimum number of necessary terminals is 23 in total, that is, 8 for output terminals, 13 for address terminals and 2 for power supply terminals, and since a plurality of P-ROM's are normally installed on one board for practical use, at least one chip-enable terminal to be used for chip selection is additionally necessitated. Furthermore, if it is desired to make this P-ROM have a power-down mode, then at least one further terminal for use in a power-down mode is necessitated. Accordingly, the required total number of terminals is at least 25.

DETAILED DESCRIPTION OF THE INVENTION

Figure 3:
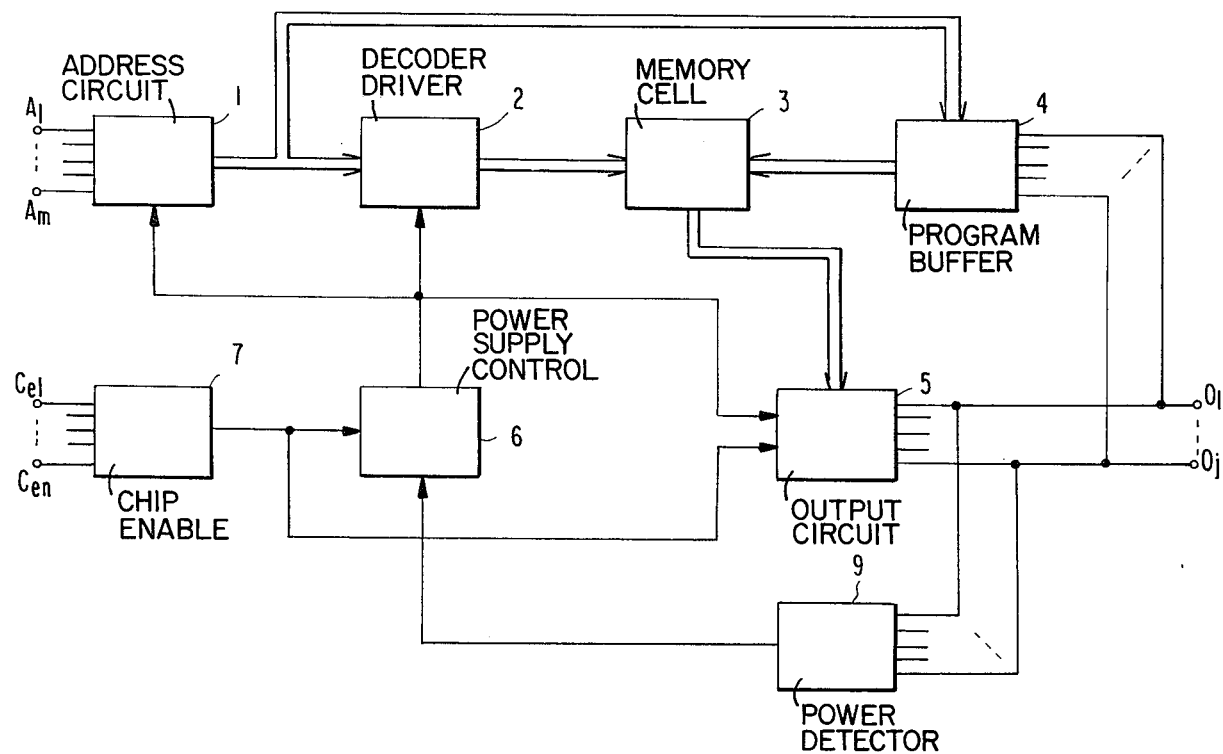
FIG. 3 is a block diagram showing a principle of the present invention.

Now the principle of the present invention will be described in more detail with reference to FIG. 3. In this figure, component parts having the same functions as those of the prior art device illustrated in FIG. 1 are given the same reference numerals, and further description thereof will be omitted. One difference between the P-ROM according to the present invention in FIG. 3 and the prior art P-ROM in FIG. 1 is that the power-down mode control terminal PC is made unnecessary by making the chip-enable terminals $Ce_1-Ce_n$ have the power-down mode function so that the PS 6 could be actuated by an unselection signal applied to the chip-enable terminals $Ce_1-Ce_n$ to inhibit power supply to the peripheral circuits and also to inactivate the OC 5. A further difference is in that there is additionally provided a detecting means, i.e. power detector circuit (PD) 9, which is connected to the output terminals $O_1-O_j$ and which releases the inhibit of power supply of the PS 6 by detecting a memorizing electric power applied to these output terminals so as to permit memorization while the chip-enable terminals $Ce_1-Ce_n$ are being applied with a signal having a signal level adapted to inactivate the OC 5. This PD 9 must be designed while paying attention to the following points. First, at the time when electric power for memorizing a program is not supplied to the output terminals such as the time of program reading operation from the MC 3, the PD 9 must not supply an output adapted to release the inhibit of power supply of the PS 6 throughout its entire output voltage region (normally $-0.5$ V-$+0.5$ V) regardless of whether upon selection or upon unselection. Secondly, so long as electric power for memorizing is being supplied to the output terminals upon programming, the PD 9 must continuously feed to the PS 6 the output adapted to release the inhibit of power supply of the PS 6 regardless of the voltage level at the output terminals $O_1-O_j$. Explaining in more detail this second criterion for design, the PD 9 is actuated by the supply of a memorization voltage which is higher than the entire output voltage region corresponding to logic-1 and logic-0, and, as a result, the inhibit of power supply in the PS 6 is released to memorize a program. However, when a sense current for checking completion of memorization is again passed through the P-ROM after the programming current was once passed there through as described previously, there is a possibility that the voltage at the output terminals $O_1$-$O_j$ may be lowered within the entire output voltage region corresponding to logic-1 and logic-0 since the PN-junction in the written memory element has been almost perfectly destroyed. For this reason, if the PD 9 is inactivated because the voltage at the output terminals $O_1$-$O_j$ is lower than that voltage, then the selection of the desired memory element becomes impossible, resulting in that the subsequent supply of a pulse of programming current cannot be performed. Therefore, even if the voltage at the output terminals $O_1$-$O_j$ is lowered to fall within the nominal $-0.5$ to $+0.5$ voltage range, the PD 9 must continue to feed an output adapted to release the inhibit of power supply in the PS 6.

In a P-ROM according to the present invention which comprises the PD 9 that is designed with attention paid to the above-described points, when the signal for inactivating the OC 5 is applied to the chip-enable terminals $Ce_1$-$Ce_n$ to perform a memorization of a program, the PS 6 is also actuated to inhibit power supply to the peripheral circuits. Under such condition, if programming electric power is applied to the output terminals $O_1$-$O_j$, then the PD 9 is actuated in response to the write voltage which is higher than the entire output voltage region corresponding logic-1 and logic-0, so that the PD 9 releases the inhibit of power supply of the PS 6. As a result, the peripheral circuits such as the ADD 1 and DD 2 necessary for programming can be activated, and hence a predetermined memory element within the MC 3 is selected by the address signal applied to the address terminals $A_1$-$A_m$. At this moment, although the power supply to the OC 5 is also made possible, the OC 5 would not be activated since the base voltage level to the final stage transistor in the OC 5 is so controlled by the CE 7 that the final stage transistor may not become conducting. Once the PC 9 is actuated, it continues to operate even if the voltage at the output terminals $O_1$-$O_j$ is lowered, and therefore, the writing of a program can be performed reliably.

On the other hand, if the signal having the selection level is applied to the chip-enable terminals $Ce_1$-$Ce_n$, the OC 5 is activated and also the power supply to the peripheral circuits is alloed by the PS 6, so that the memorized information can be read out. In this instance, since the PD 9 is not actuated by the voltage at the output terminals $O_1$-$O_j$ generated by the read information, erroneous operations would not occur.

In addition, if the OC 5 is inactivated by the application of the signal having the unselection level to the chip-enable terminals $Ce_1$-$Ce_n$, the PS 6 is also actuated to inhibit the power supply to the peripheral circuits, so that a power-down mode would be realized.

DETAILED DESCRIPTION OF PREFERRED EMBODIMENTS

Figure 4:
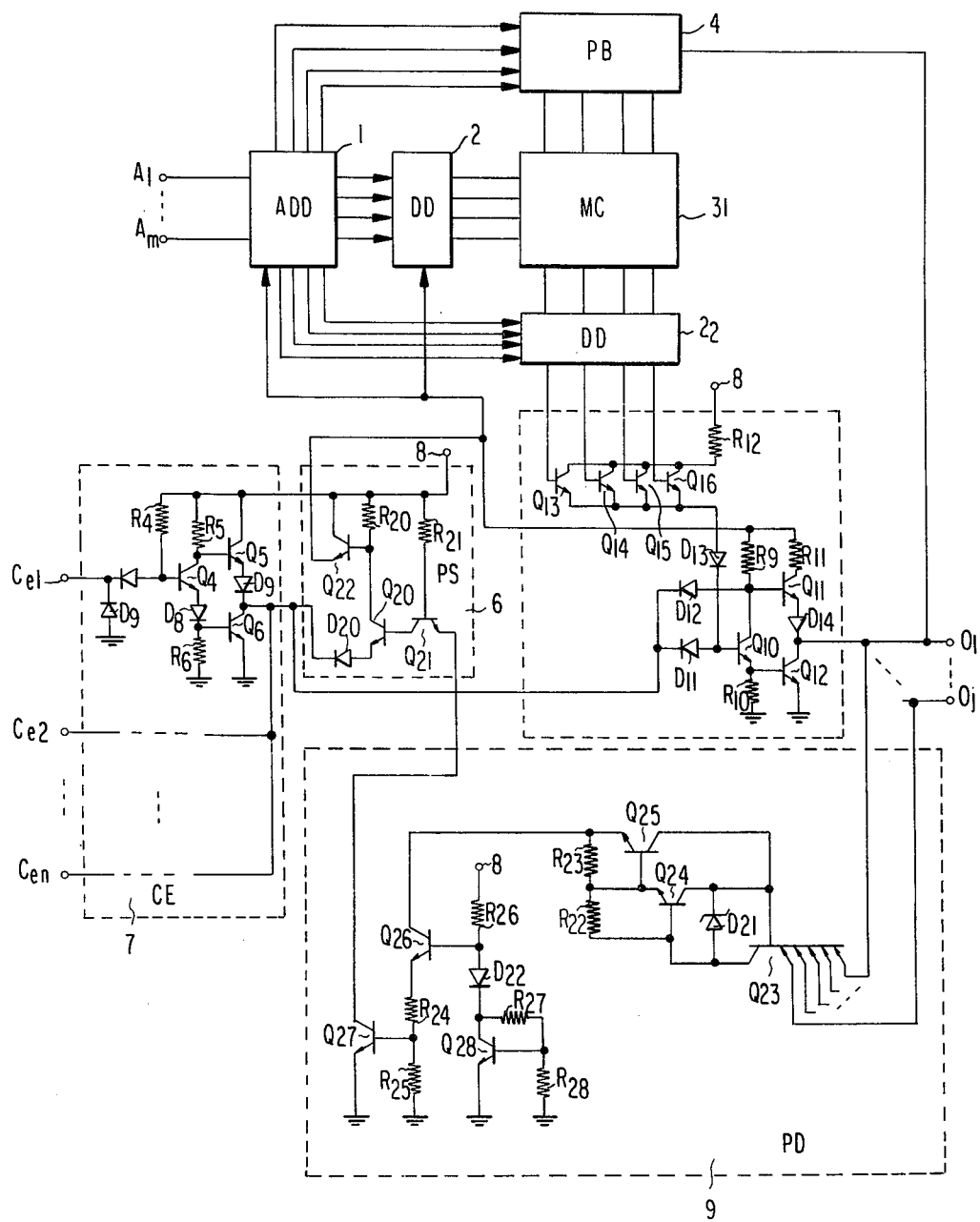
FIG. 4 is a wiring diagram showing details of some blocks in FIG. 3 which are constructed according to one preferred embodiment of the present invention.

Now description will be made of one preferred embodiment of the present invention with reference to FIG. 4 which includes the PD 9 statisfying the above-described two criteria in design, and in which the activation and inactivation of the OC 5 can be controlled through the chip-enable terminals $Ce_1$-$Ce_n$ and a power-down mode can be achieved. It is to be noted that detailed circuit arrangements in the blocks of the OC 5, PS 6, CE 7 and PD 9 are illustrated in FIG. 4. Among these circuit components, with regard to the output circuit only the OC 5' connected to the output terminal $O_1$ is illustrated and the remaining output circuits connected respectively to the other output terminals $O_2$-$O_j$ are omitted because they are indentical in construction to the OC 5'. In addition, since the circuit arrangement in the OC 5' is quite the same as that shown in FIG. 2, like reference numerals are given to the corresponding circuit elements to omit the description of this circuit arrangement in the OC 5'. Moreover in the CE 7, the circuit portions connected respectively to the chip-enable terminals $Ce_2$-$Ce_n$ are omitted because they are identical to the circuit portion connected to the chip-enable terminal $Ce_1$. Also, since the circuit arrangement of the circuit portion connected to the chip-enable terminal $Ce_1$ is exactly identical to that shown in FIG. 2, like reference numerals are given to the corresponding circuit elements to omit the description thereof.

In FIG. 4, the collector outputs of the respective transistors $Q_6$ corresponding to the chip-enable terminals $Ce_1$-$Ce_n$ are connected in common, and this common junction serves as an output of the CE 7. This output is applied to the bases of the transistors $Q_{10}$ and $Q_{11}$, respectively, in the OC 5', and simultaneously applied to the PS 6. The PS 6 receives the output at the emitter of a transistor $Q_{20}$ via a diode $D_{20}$. The collector of the transistor $Q_{20}$ is connected via a resistor $R_{20}$ to a power supply terminal 8, and its base is connected to the collector of a transistor $Q_{21}$. To the respective ends of the resistor $R_{20}$ are connected the base and collector of a transistor $Q_{22}$, and the emitter of the transistor $Q_{22}$ serves as an output for supplying electric power to the OC 5', ADD 1 and row selection $DD2_1$. The base of the transistor $Q_{21}$ is connected via a resistor $R_{21}$ to the power supply terminal 8, and to its emitter is applied an output of the PD 9. Although the schematic arrangement may be somewhat different, it will be appreciated that the circuit connections of PS 6 in FIGS. 2 and 4 are identical with the exception that the signal to the emitter of $Q_{21}$ comes from PD 9 rather than from the collector of transistor $Q_3$ as in FIG. 2.

The PD 9 includes a PNP transistor $Q_{23}$ having a plurality of emitters respectively connected to the output terminals $O_1$-$O_j$. Between the base and collector of the multi-emitter type transistor $Q_{23}$ is connected a Zener diode $D_{21}$, and also the collector and base respectively, of an NPN transistor $Q_{24}$. To the emitter and collector of the transistor $Q_{24}$ are respectively connected the base and collector of another transistor $Q_{25}$, and between the base and emitter of the transistors $Q_{24}$ and $Q_{25}$ are respectively connected resistors $R_{22}$ and $R_{23}$. The emitter of the transistor $Q_{25}$ is also connected to the collector of a transistor $Q_{26}$. The base of the transistor $Q_{26}$ is connected through a resistor $R_{26}$ to the power supply terminal 8, and is also grounded through a diode $D_{22}$ and resistors $R_{27}$ and $R_{28}$. To the respective ends of the resistor $R_{27}$ are connected the collector and base of a transistor $Q_{28}$, and its emitter is grounded. The emitter of the transistor $Q_{26}$ is grounded via resistors $R_{24}$ and $R_{25}$. To the respective ends of the resistor $R_{25}$ are connected the base and emitter of a transistor $Q_{27}$, and from its collector is derived an output of the PD 9 which is applied to the PS 6, that is, to the emitter of the transistor $Q_{21}$ in the PS 6.

The operation of the P-ROM according to the present embodiment having the above-described circuit construction will be described. At first, when the chip enable signal having the selection level (logic-0 level) is applied to the chip-enable terminal $Ce_1$, the collector output from the transistor $Q_6$ takes the logic-1 level. Since the circuit portions associated with the chip-enable terminals $Ce_2-Ce_n$, respectively, have the same circuit arrangement, in response to the application of the signal having the selection level to all the chip-enable terminals $Ce_1-Ce_n$, the output of the CE 7 takes the logic-1 level. Owing to the output of the CE 7 at the logic-1 level, the diodes $D_{11}$ and $D_{12}$ within the OC 5' are reverse biased, and hence the OC 5' is activated. This output of the CE 7 is also applied to the emitter of the transistor $Q_{20}$ through the diode $D_{20}$. At this moment, since the circuit constant is so selected that unless programming electric power is supplied to any one of the output terminals $O_1-O_j$, the output stage transistor $Q_{27}$ in the PD 9 may not become conductive, the transistors $Q_{20}-Q_{21}$ in the PS 6 would become non-conductive. Consequently, the transistor $Q_{22}$ becomes conductive, and the power supply to the OC 5', ADD 1 and row selection DD $2_1$ is enabled, resulting in that these circuit components are activated. As a result, program information stored in the memory element in the MC 3' designated by the address signal can be read out through the OC 5'.

When at least one of the chip-enable terminals $Ce_1-Ce_n$ takes the unselection level (logic-1 level), the collector output of the transistor $Q_6$ becomes the logic-0 level, so that the output of the CE 7 also becomes the logic-0 level. Consequently, the base potentials of the transistors $Q_{10}$ and $Q_{11}$ in the OC 5' are lowered, and thereby the OC 5' is inactivated. This logic-0 output of the CE 7 is applied to the emitter of the transistor $Q_{20}$ in the PS 6. As described previously, the final stage transistor $Q_{27}$ in the PD 9 is non-conductive, so that a current flowing through the base-collector path of the transistor $Q_{21}$ is fed to the base-emitter path of the transistor $Q_{20}$, and thereby the transistor $Q_{20}$ is turned on. Therefore, the transistor $Q_{22}$ becomes non-conductive, so that the power-supply to the OC 5' and the peripheral circuits is inhibited. Thereby, the power-down mode upon unselection is realized. As will be readily understood with reference to the above explanation, only one chip-enable terminal need be provided.

Next, the operation in the case of effecting the memorizing of a program in a non-programmed memory element in the MC 3' will be explained. In this case, since the output terminal $O_1$ is connected to the collector of the final stage transistor $Q_{12}$ in the OC 5' and a signal fed from the MC 3' is applied to the base of the transistor $Q_{12}$, the OC 5' must necessarily be inactivated as fully described previously in connection with FIG. 2. Accordingly, at least one of the chip-enable terminals $Ce_1-Ce_n$ must be applied with the signal having the unselection level (logic-1 level). Then, in response to the application of the signal at the unselection level the PS 6 is actuated simultaneously, and thereby the power supply to the peripheral circuits is inhibited. However, in the P-ROM according to the present embodiment of the present invention, even under such a condition, memorizing a program in the P-ROM becomes possible.

More particularly, an address signal is applied to the address terminals $A_1-A_m$ for the purpose of designating a memory element to be programmed. Then, since the ADD 1 is not activated, the selection of the memory element cannot be performed. While the address signal is kept applied to the address terminals $A_1-A_m$, a programming electric power for memorizing a program is applied through the output terminal $O_1$. Reviewing the circuit arrangement in the PD 9, between the base and collector of the transistor $Q_{23}$ is connected the Zener diode $D_{21}$. Accordingly, so long as this Zener diode $D_{12}$ does not breakdown, the transistor $Q_{23}$ cannot become conductive and the PD 9 cannot operate. A voltage $V_o$ at the output terminal $O_1$ which is necessitated for the Zener diode $D_{12}$ to break down, can be represented as the sum of base-emitter voltages $V_{BE}$ (=0.8 V) of the transistors $Q_{27}$, $Q_{25}$, $Q_{24}$ and $Q_{23}$, a voltage drop across the resistor $R_{24}$, a collector-emitter saturated voltage $V_{CE}(Sat)Q_{26}$ (=0.2 V) of the transistor $Q_{26}$ and a breakdown voltage $V_{D21}$ (=8 V) of the Zener diode $D_{21}$. Accordingly, even if the unknown voltage drop across the resistor $R_{24}$ is omitted, unless the voltage $V_o$ at the output terminal $O_1$ reaches at least about 11.4 V, the Zener diode $D_{21}$ would not break down. As will be seen from the above-described fact, in the entire voltage region ($-0.5$ V-$+0.5$ V) corresponding to logic-1 and logic-0 which voltage is obtained at the output terminal $O_1$ upon normal read-out operation, the Zener diode $D_{21}$ would never break down, and therefore, the PD 9 is never actuated.

However, in the case of memorizing a program, since the voltage at the output terminal $O_1$ is raised approximately to 28 V by the supply of the programming electric power, the Zener diode $D_{21}$ breaks down, so that the transistor $Q_{23}$ becomes conductive and draws a part of the current necessitated for the programming operation. Since the transistors $Q_{24}$ and $Q_{25}$ become conductive by the conduction of the transistor $Q_{23}$, the part of the programming current drawn by the transistor $Q_{23}$ flows through these transistors to the transistor $Q_{26}$. As the base of the transistor $Q_{26}$ is applied with a bias voltage produced by bias circuit connected between the power supply terminal 8 and the ground and consisting of the resistors $R_{26}$, $R_{27}$ and $R_{28}$, diode $D_{22}$ and transistor $Q_{28}$, the transistor $Q_{26}$ has been already activated, and consequently, the drawn part of the memorizing current is fed to the resistors $R_{24}$ and $R_{25}$ and the transistor $Q_{27}$. Since the resistance value of the resistor $R_{25}$ is selected so that the voltage generated across it by the part of the programming current may sufficiently forward bias the base-emitter junction of the transistor $Q_{27}$, the transistor $Q_{27}$ turns on immediately. When the transistor $Q_{27}$ conducts, the base-emitter junction of the transistor $Q_{21}$ in the PS 6 is also forward biased, so that it becomes conductive. Then, the transistor $Q_{20}$ is reverse biased, so that the transistor $Q_{22}$ which has been in a cut-off condition by that time, becomes conductive and thus supplies electric power to the OC 5', ADD 1 and row selection DD $2_1$. As the transistors $Q_{10}$, $Q_{11}$ and $Q_{12}$ in the OC 5' are in the reverse biased condition due to the signal applied from the CE 7, the OC 5' is kept inactivated even though the power supply from the PS 6 is effected. On the other hand, owing to the power supply to the ADD 1 and row selection DD $2_1$, these component circuits are activated, so that the desired memory element can be designated in accordance with the address signal supplied to the address terminals $A_1-A_m$.

The value of the current drawn by the transistor $Q_{26}$ from the programming current should be determined so as to reduce the power consumption in the PD 9 while also supplying a sufficient current through the MC 3'. Normally, the sense current is about 20 mA and the programming current is about 200 mA, and so, from the above-mentioned view point the value of the current drawn by the PD 9 was selected to be 1 mA in the illustrated embodiment. Provided that the current amplification factor $h_{FE}$ of the transistor $Q_{26}$ is sufficiently high, this current value can be appropriately preset by selecting the base bias voltage of the transistor $Q_{26}$ and the resistance of the resistor $R_{24}$. In addition, to the base of the transistor $Q_{26}$ is applied the bias voltage obtained by the bias circuit connected between the power supply terminal 8 and the ground and consisting of the resistors $R_{26}$, $R_{27}$ and $R_{28}$, diode $D_{22}$ and transistor $Q_{28}$, so that such circuit serves as a current source. Accordingly, a current dependent upon the current flowing through the transistor $Q_{26}$ flows through the diode $D_{22}$. The ratio between these currents is determined by the ratio between the impedances of the respective current paths viewed from the base of the transistor $Q_{26}$. Current supply from the power supply terminal 8 to these current paths is effected even when the Zener diode $D_{21}$ has not broken down, that is, even when the PD 9 is inactivated. Therefore, in order to reduce the power consumption upon inactivation of the PD 9, the ratio of the impedance on the emitter side to the impedance on the diode $D_{22}$ side viewed from the base of the transistor $Q_{26}$ is selected to be nearly 1:10. More specifically, the resistances of the resistors $R_{24}$, $R_{25}$, $R_{27}$ and $R_{28}$ are chosen at 1 k ohm, 0.8 k ohm, 8 k ohm, respectively. The bias circuit connected between the base of the transistor $Q_{26}$ and the ground and consisting of the diode $D_{22}$, resistors $R_{27}$ and $R_{28}$ and transistor $Q_{28}$ has a capability of compensating for variations of the power supply voltage and the environmental temperature to maintain the bias voltage approximately constant. More particularly, since the resistor $R_{27}$ is connected between the base and collector of the transistor $Q_{28}$, this transistor operates in an unsaturated region. Now, if the voltage applied to the power supply terminal 8 should rise, the current flowing through the diode $D_{22}$ would be increased. However, the variation of the voltage generated across the diode $D_{22}$ caused by the increase of the current flowing therethrough is small. Moreover, if the voltage drop across the resistor $R_{28}$ tends to become larger due to the increase of the current flowing therethrough, then the current flowing through the collector of the transistor $Q_{28}$ is increased, so that the voltage variations across the resistors $R_{27}$ and $R_{28}$ become small. On the other hand, if the power supply voltage should be reduced, the voltage variation across the diode $D_{22}$ would be small and the collector current flowing through the transistor $Q_{28}$ would be reduced, so that the voltage drop across the resistor $R_{27}$ would be increased. Against the variation of the environmental temperature, similar compensation can be effected. For the above-mentioned reasons, the base bias voltage for the transistor $Q_{26}$ can be maintained approximately constant. As a matter of course, the base bias voltage is different between activation of the PD 9 and inactivation thereof. This is because the current flowing through the bias circuit varies in response to the current flowing through the transistor $Q_{26}$, and as a result, the voltage drops across the diode $D_{22}$ and resistor $R_{27}$ as well as the base-emitter voltage of the transistor $Q_{28}$ varies.

If the power supply voltage applied to the power supply terminal 8 is selected at 5 V and the resistance of the resistor $R_{26}$ is selected at 13 kohm, then the base bias voltage for the transistor $Q_{26}$ upon the inactivation of PD 9 becomes about 1.4 V because of the above-described resistance ratio. Since a part of the current fed from the power supply terminal 8 flows also into the side of the base of the transistor $Q_{26}$, the base-emitter voltage of the transistor $Q_{26}$ becomes nearly 0.7 V. Then, as the resistance values of the resistors $R_{24}$ and $R_{25}$ are chosen to be 1 kohm and 0.8 kohm, respectively, the base potential of the transistor $Q_{27}$ becomes about 0.3 V. This base potential would perfectly cut off the transistor $Q_{27}$, and therefore, the PS 6 continues to inhibit the power supply when the PD 9 is inactivated.

When the Zener diode $D_{21}$ breaks down by the application of the memorizing electric power to the output terminal $O_1$, the current flows through the transistor $Q_{26}$. Consequently, the current flowing through the diode $D_{22}$ increases and the base voltage of the transistor $Q_{26}$ becomes about 2.65 V. Since the base current of the transistor $Q_{26}$ also increases, its base-emitter voltage becomes approximately 0.8 V. Then, the base potential of the transistor $Q_{27}$ becomes about 0.8 V by the resistors $R_{24}$ and $R_{25}$. Therefore, the transistor $Q_{27}$ becomes conductive. Then, the transistor $Q_{21}$ becomes conductive, while the transistor $Q_{20}$ becomes non-conductive as described previously, so that the power supply from the PS 6 can be inhibited. In addition, since the base potential and base-emitter voltage of the transistor $Q_{26}$ as well as the base potential of the transistor $Q_{27}$ are maintained approximately constant, the current flowing through the resistor $R_{24}$ becomes nearly 1.05 mA due to its resistance value of 1 kohm. Considering the base current of the transistor $Q_{26}$, the collector current of the transistor $Q_{26}$, that is, the current drawn by the PD 9 is estimated to be about 1 mA. Since a voltage of about 1.05 V is generated across the resistor $R_{24}$ when the PD 9 is activated, the above-described voltage $V_0$ at the output terminal $O_1$ which is necessitated for the Zener diode $D_{21}$ to break down can be estimated to be about 12.5 V by adding the above voltage across the resistor $R_{24}$ to the previously estimated value of about 11.4 V.

As described above, by the application of the programming electric power to the output terminal $O_1$, the PD 9 is activated to inhibit of power supply of the PS 6, so that the ADD 1 and row selection DD $2_1$ are activated. As a result, the desired memory element in the MC 3' can be selected while the OC 5' is kept inactivated, and therefore the memorizing operation according to the program information becomes possible.

Although the voltage at the output terminal $O_1$ becomes about 28 V when the electric power for programming is applied thereto, the voltage at the output terminal $O_1$ is lowered to about 8 V because of the primary break down of the base-emitter PN junction of the selected memory element by the supply of the sense current. However, even though the voltage at the output terminal $O_1$ is lowered, the once activated PD 9 would not return to its inactivated condition. Circuit elements achieving this function are the transistors $Q_{23}$, $Q_{24}$ and $Q_{25}$ and the resistors $R_{22}$ and $R_{23}$. More particularly, the circuit construction consisting of the PNP transistor $Q_{23}$ and the NPN transistor $Q_{24}$, having the collector and base respectively connected to the base and collector of the PNP transistor $Q_{23}$, is a PNPN thyristor structure, and what triggers the thyristor is the Zener diode $D_{21}$. Accordingly, by the application of the programming power to the output terminal $O_1$, the Zener diode $D_{21}$ breaks down and triggers the thyristor consisting of the transistors $Q_{23}$ and $Q_{24}$, and this thyristor becomes conductive. As is well known, once a thyristor is turned on, it cannot be cut off in spite of the lowered supply voltage unless a current fed thereto is reduced to a value less than its own holding current. Therefore, even if the primary break down of the PN-junction of the designated memory element occurs, the PD 9 does not become non-conductive because the current fed from the output terminal $O_1$ is not reduced to the value less than the holding current of the PNPN thyristor structure. It is to be noted that the transistor $Q_{25}$ and the resistors $R_{22}$ and $R_{23}$ are not necessitated in principle, but these are added for the purpose of making the holding current of the thyristor consisting of the transistors $Q_{23}$ and $Q_{24}$ small and also enhancing the operation speed.

Subsequently, in order to check if the program information has been correctly memorized in the selected memory element, the sense current is again passed through the memory element after the programming. At this moment, the voltage at the output terminal $O_1$ is further reduced, so that it may possibly be lowered to a voltage within the entire voltage region corresponding to logic-1 and logic-0 upon the reading operation. However, even in such a case, since the current supply from the output terminal $O_1$ is present, the PD 9 would not return to its inactivated condition.

As will be obvious from the above description, the PD 9 according to the illustrated embodiment satisfies all the required characteristics. Accordingly, upon normal reading the PD 9 is by no means activated and also its power consumption is reduced. In addition, upon writing a program, the PD 9 is activated by the application of the programming electric power, so that the ADD 1 and row selection DD $2_1$ which have been inhibited from being supplied with electric power are activated to memorize data. Furthermore, once the PD 9 has been activated, it would not return to its inactivated condition even if the voltage at the output terminal $O_1$ is lowered so long as the programming electric power is not cut off.

As described above, a novel P-ROM has been provided in which memorization of a program is made possible even though terminals $Ce_1-Ce_n$ may have the function of controlling both activation and inactivation of the OC and the power-down mode. Consequently, in the case where a P-ROM of 8-bit output having a memory capacity of 64K bits and power-down mode capability is manufactured, a terminal for controlling activation and inactivation of the OC 5 and a terminal for controlling a power-down mode can be provided in common and also the number of such terminals can be reduced to one, so that the total number of terminals can be reduced to 24. Therefore, the P-ROM according to the present invention is more compact and less expensive.

Figure 5:
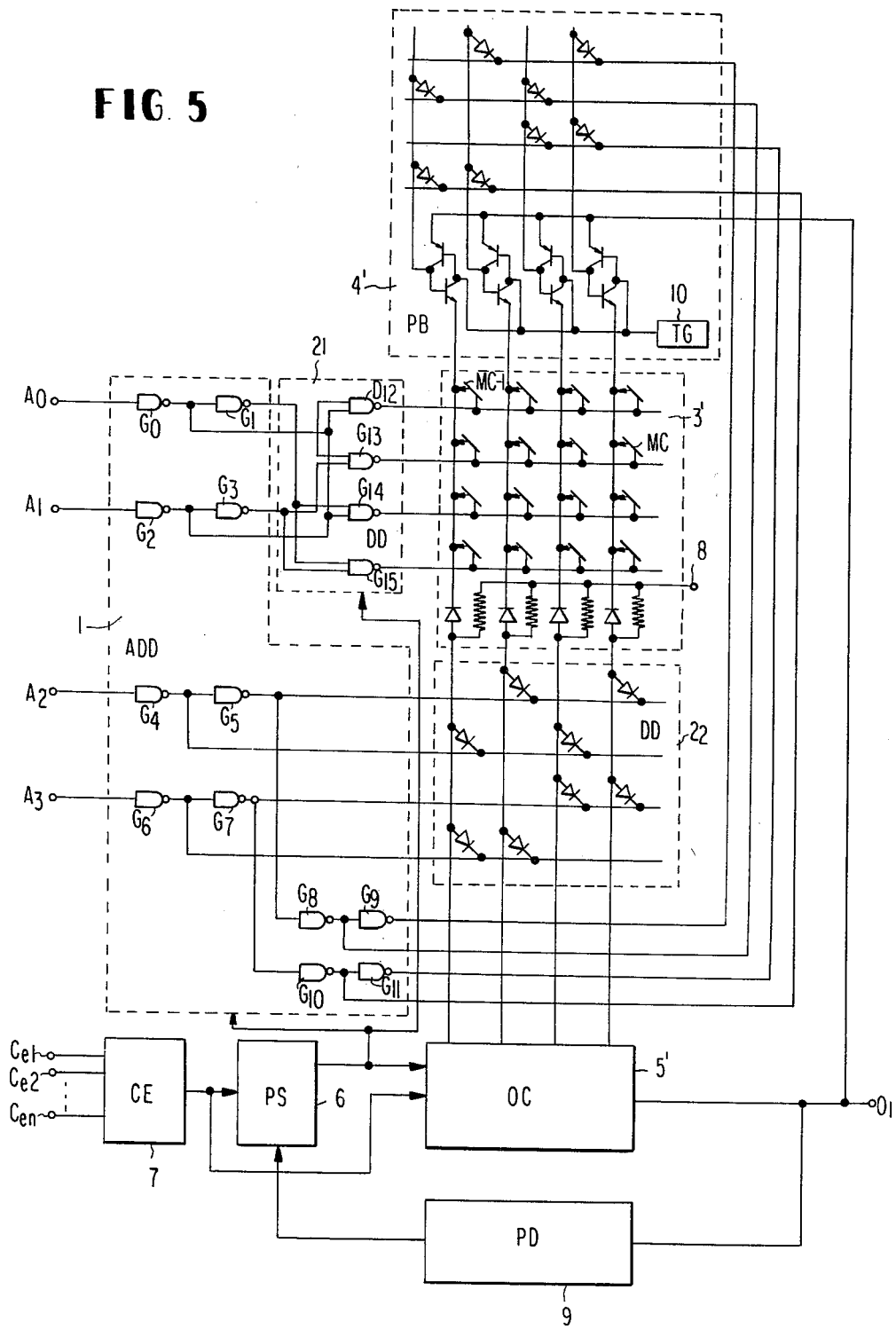
FIG. 5 is a wiring diagram showing details of other blocks in FIG. 3.

Next, the operation of programming will be explained in more detail with reference to FIG. 5. Since the circuit portions which are essential for the present invention have been already illustrated in detail in FIG. 4, FIG. 5 shows one example of the detailed construction of the peripheral circuits which are necessitated for programming. As the address terminals, by way of example, only four terminals $A_0$, $A_1$, $A_2$ and $A_3$ are shown. Moreover, although one output terminal $O_1$ is illustrated in this figure, in case of, for example, a 4-bit output, it is only necessary to provide 4 sets of output terminal $O_1$, MC 3', PB 4', column selection DD $2_2$ and OC 5' in parallel and to supply the outputs of the CE 7 and PS 6 to the respective OC's 5'. With regard to the connections from the respective output terminals $O_1$ to the PD 9, since the first stage transistor $Q_{23}$ of the PD 9 has a multi-emitter structure, it is only necessary to connect the respective output terminals $O_1$ to the different emitters of the transistor $Q_{23}$.

In FIG. 5, the ADD 1 is composed of twelve 1-input NAND circuits $G_0-G_{11}$, and to the address terminals $A_0$ and $A_1$ are respectively connected series connections of two NAND circuits $G_0$, $G_1$ and $G_2$, $G_3$. Outputs of the respective NAND circuits $G_0$ to $G_3$ are derived and led to the row selection DD $2_1$. Also to the address terminals $A_2$ and $A_3$ are respectively connected series connections of four NAND circuits $G_4$, $G_5$, $G_8$, $G_9$ and $G_6$, $G_7$, $G_{10}$, $G_{11}$. Outputs of the respective NAND circuits $G_4$ to $G_{11}$ are derived and distributed between the column selection DD $2_2$ and the PB 4'. The row selection DD $2_1$ is composed of four 2-input NAND circuits $G_{12}-G_{15}$, and the respective outputs of these NAND circuits $G_{12}-G_{15}$ are applied to the row lines of the MC 3'. The column selection DD $2_2$ is composed of a diode matrix and coupled to the column line of the MC 3'. Therefore, the address terminals $A_0$ and $A_1$ are used for row selection of the MC 3', while the address terminals $A_2$ and $A_3$ are used for column selection. The PB 4' includes a decoder-driver for column selection having the same construction as the column selection DD $2_2$ and thereby selects a desired column line in the MC 3' upon writing a program. Furthermore, the PB 4' includes a write circuit for supplying programming electric power to the MC 3', and this write circuit contains a group of transistors which form four thyristor structures similar to that formed of the transistors $Q_{23}$ and $Q_{24}$ in the PD 9, and a trigger circuit 10 for triggering these thyristor structures.

By means of the above-described circuit construction, only one memory element within the MC 3' can be selected in accordance with the combination of address signals applied to the address terminals $A_0$ to $A_3$. For instance, if a signal of logic-0 is applied to all the address terminals $A_0$ to $A_3$, then among the four row lines only the uppermost row line takes the logic-0 level and the other row lines are held at the logic-1 level. Also among the four column lines only the leftmost column line takes the logic-1 level, so that the diode connected thereto is reverse biased. In this type of P-ROM, in order to recognize whether a memory element stores logic-1 or logic-0 by passing a current through the memory element, the selected memory element must be so biased that a current can be passed therethrough. Accordingly, under the above-mentioned address input condition, only the memory element MC-1 connected between the uppermost row line and the leftmost column line has been biased so as to meet such requirement. That is, the memory element MC-1 can be selected by applying the logic-0 signal to all the address terminals $A_0$ to $A_3$.

As described previously in connection with FIG. 4, upon memorizing a program, the OC 5' must be inactivated by applying the logic-1 level to the chip-enable terminals $Ce_1-Ce_n$. Then, the logic-0 address signal is applied to all the address terminals $A_0$ to $A_3$ in the above-assumed case, and thereafter programming electric power is supplied to the output terminal $O_1$. By the supply of writing electric power, since the PD 9 is activated to cancel the inhibit of power supply of the PD 6, the ADD 1 and row selection DD $2_1$ are activated. Thereby, the memory element MC-1 in the MC 3' is selected. Here, it is to be noted that when the programming electric power is applied through the output terminal $O_1$, the program memorizing circuit in the PB 4' would not immediately become active. More particularly, when the programming electric power is applied, a current flows through PN-junctions of PNP transistors in the write circuit to the trigger circuit (TG) 10. The TG 10, by the current flowing thereto, generates a clamp voltage (26 V) a little lower than the voltage (28 V) generated by the feeding of the programming current. When, the charge-up necessary for the write circuit to be activated has been completed, the PNPN circuit in the write circuit becomes active, resulting in that the current necessitated for programming is fed to the MC 3'. Therefore, before the TG 10 generates the clamp voltage, the PD 9 is activated, so that the ADD 1 and row selection DD $2_1$ are also activated to designate the memory cell MC-1. When the sense current flows through the selected memory cell MC-1, the primary break down of the emitter-base PN-junction of this memory cell occurs. If the voltage at the output terminal $O_1$ becomes about 8 V or higher by the primary breakdown, then the selected memory cell MC-1 is recognized to be in a non-memorized condition, so that the large programming current is supplied to the memory cell MC-1 to destroy its emitter-base PN-junction. At this moment, although the voltage at the output terminal $O_1$ is lowered, the PD 9 is kept activated as described previously, so that the peripheral circuits are also kept activated. Thereafter, the sense current for checking the write operation is fed to the memory cell MC-1. At this time, since the base-emitter PN-junction has been already destroyed by the application of the programming current, the voltage at the output terminal $O_1$ becomes lower than 6 V. If this voltage cannot be obtained, the programming current is again applied to the memory cell MC-1. When the voltage at the output terminal $O_1$ cannot be lowered to 6 V or less even though this procedure is repeated several times, this P-ROM is determined to be defective. When the voltage at the output terminal $O_1$ of 6 V or less is obtained, the pulse-shaped programming current is again applied to the memory cell MC-1 in order to surely destroy the base-emitter PN-junction of the memory cell MC-1. Subsequently, the address signal is varied, and writing of a program is performed in a similar manner for another memory cell.

Figure 6A:
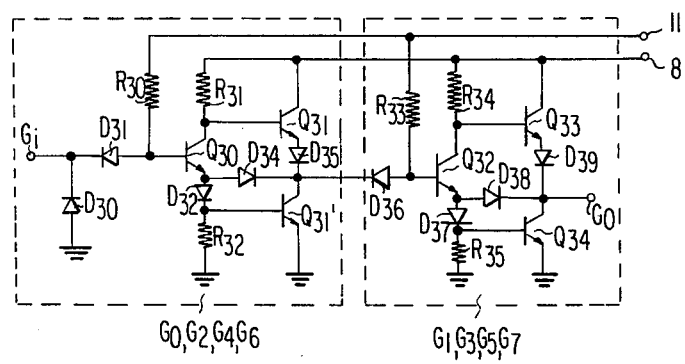
FIGS. 6a, 6b and 6c are detailed circuit diagrams showing detailed structures of various gate portions symbolically shown in FIG. 5.
Figure 6B:
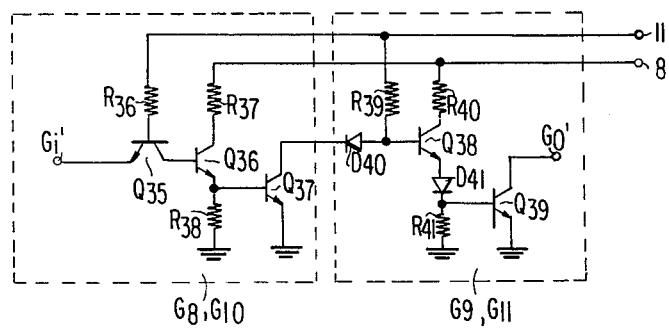
Figure 6C:
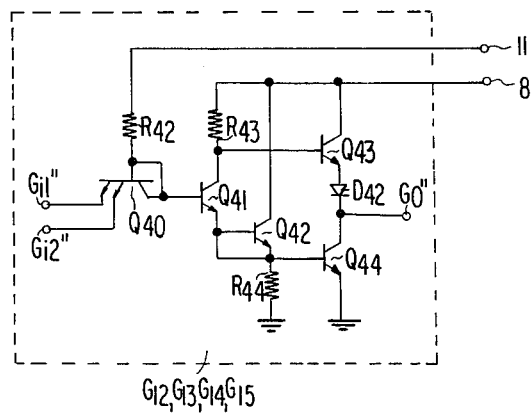

FIGS. 6a to 6c illustrate one example of the detailed circuit construction of the NAND circuits composing the ADD 1 and row selection DD $2_1$. Among these figures, FIG. 6a shows the series connected NAND circuits $G_0$ and $G_1$, $G_2$ and $G_3$, $G_4$ and $G_5$ or $G_6$ and $G_7$ coupled to the address terminal $A_0$, $A_1$, $A_2$ or $A_3$, respectively. FIG. 6b shows the series connected NAND circuits $G_8$ and $G_9$ or $G_{10}$ and $G_{11}$, and FIG. 6c shows the 2-input NAND circuit $G_{12}$, $G_{13}$, $G_{14}$ or $G_{15}$ included in the row selection DD $2_1$.

Referring now to FIG. 6a, in the NAND circuit $G_0$, $G_2$, $G_4$ or $G_6$ connected to the address terminal $A_0$, $A_1$, $A_2$ or $A_3$, respectively, an input terminal $G_i$ is grounded via a diode $D_{30}$ and connected through a diode $D_{31}$ to a base of a transistor $Q_{30}$. The emitter of the transistor $Q_{30}$ is grounded through a diode $D_{32}$ and a resistor $R_{32}$, and its collector is connected via a resistor $R_{31}$ to a power supply terminal 8. The collector of the transistor $Q_{30}$ is also connected to a base of a transistor $Q_{31}$ and the collector of the latter is connected to the power supply terminal 8. The emitter of the transistor $Q_{31}$ is connected via a diode $D_{35}$ to a collector of a transistor $Q_{31}'$, whose base and emitter are respectively connected to either end of the resistor $R_{32}$. The emitter of the transistor $Q_{30}$ is also connected via a diode $D_{34}$ to the collector of the transistor $Q_{31}'$, and thence an output of the NAND circuit $G_0$, $G_2$, $G_4$ or $G_6$ is derived. To the base of the transistor $Q_{30}$ is connected a second power supply terminal 11 through a resistor $R_{30}$, and the output of the PS 6 is supplied to the second power supply terminal 11.

The output of the NAND circuit $G_0$, $G_2$, $G_4$ or $G_6$ is applied via a diode $D_{36}$ to the base of a transistor $Q_{32}$ serving as an input to the NAND circuit $G_1$, $G_3$, $G_5$ or $G_7$. To the base of the transistor $Q_{32}$ is also connected the second power supply terminal 11 through a resistor $R_{33}$. The emitter of the transistor $Q_{32}$ is grounded through a diode $D_{37}$ and a resistor $R_{35}$, and its collector is connected via a resistor $R_{34}$ to the power supply terminal 8 and also serves as a base input to a transistor $Q_{33}$. The collector of the transistor $Q_{33}$ is connected to the power supply terminal 8, and its emitter is connected via a diode $D_{39}$ to the collector of a transistor $Q_{34}$. The base and emitter of the transistor $Q_{34}$ are respectively connected to either ends of the resistor $R_{35}$. In addition, the emitter of the transistor $Q_{32}$ is connected via a diode $D_{38}$ to the collector of the transistor $Q_{34}$, and the junction point is connected to an output terminal $G_0$. The output terminal $G_0$ of the NAND circuit $G_1$, $G_3$, $G_5$ or $G_7$ is coupled to the row and column selection DD $2_1$ and $2_2$.

In the above-described circuit construction, if electric power is not supplied from the PS 6 to the second power supply terminal 11, then the bases of the transistors $Q_{30}$ and $Q_{32}$ are in a floating condition, so that regardless of the signal level at the input terminal $G_i$, the NAND circuits $G_0$ to $G_7$ become inactivated. On the contrary, if electric power is supplied from the PS 6, then at the respective outputs of the NAND gates $G_0$ to $G_7$ can be obtained a signal level that is derived by inverting the input signal level.

Explaining now the circuit construction shown in FIG. 6b, the outputs of the NAND circuits $G_5$ and $G_7$ are applied to input terminals $G_i'$ of the NAND circuits $G_8$ and $G_{10}$, respectively, and the input terminal $G_i'$ is connected to an emitter of a transistor $Q_{35}$. The base of the transistor $Q_{35}$ is connected via a resistor $R_{36}$ to a second power supply terminal 11 to which the output of the PS 6 is applied, and its collector is connected to the base of a transistor $Q_{36}$. The collector of the transistor $Q_{36}$ is connected to a power supply terminal 8 through a resistor $R_{37}$, and its emitter is grounded through a resistor $R_{38}$ and also connected to the base of a transistor $Q_{37}$. The emitter of the transistor $Q_{37}$ is grounded and from its collector is derived an output of the NAND circuit $G_8$ or $G_{10}$. Its output is applied via a diode $D_{40}$ to a base of a transistor $Q_{38}$ serving as an input of the NAND circuit $G_9$ or $G_{10}$. The base of the transistor $G_{38}$ is also connected through a resistor $R_{39}$ to the second power supply terminal 11. The collector of the transistor $Q_{38}$ is connected through a resistor $R_{40}$ to the power supply terminal 8, and its emitter is grounded via a diode $D_{41}$ and a resistor $R_{41}$. To the respective ends of the resistor $R_{41}$ are connected the base and emitter of a transistor $Q_{39}$, and its collector is connected to an output terminal $G_0'$ of the NAND circuit $G_9$ or $G_{10}$. The output terminal $G_0'$ and the output of the NAND circuit $G_8$ or $G_{10}$ are connected to a column selection decoder-driver circuit contained within the PB 4'.

In such a circuit construction also, if the power supply from the PS 6 to the second power supply terminal 11 is inhibited, the bases of the transistors $Q_{35}$ and $Q_{38}$ are in the floating condition, so that the NAND circuits $G_8$ to $G_{11}$ are kept inactivated regardless of their input condition. On the contrary, if the power supply is allowed, the output signal levels of these circuits are the inversion of the input levels.

Explaining now the NAND circuits $G_{13}$ to $G_{15}$ in the row selection DD $2_1$ illustrated in FIG. 6c, the output from the ADD 1 is applied to two input terminals $G_{i1}''$ and $G_{i2}''$, which are connected to two emitters of a transistor $Q_{40}$. The base of the transistor $Q_{40}$ is connected to the second power supply terminal 11 via a resistor $R_{42}$, and is also connected to its collector, and the junction point is connected to the base of a transistor $Q_{41}$. The collector of the transistor $Q_{41}$ is connected through a resistor $R_{43}$ to the power supply terminal 8, and is also connected to the base of a transistor $Q_{43}$. The emitter of the transistor $Q_{41}$ is connected to the base and emitter of a transistor $Q_{42}$, and is further grounded via a resistor $R_{44}$. The collector of the transistor $Q_{42}$ is connected to the power supply terminal 9, and its emitter is connected to the base of a transistor $Q_{44}$. The emitter of the transistor $Q_{44}$ is grounded, and its collector is connected via a diode $D_{42}$ to the emitter of the transistor $Q_{43}$ and also directly connected to an output terminal $G_0''$. The output terminals $G_0''$ of the NAND circuits $G_{12}$ to $G_{15}$ are coupled to the respective row lines of the MC 3'.

In the above-described construction, in the case where electric power is not supplied from the PS 6 to the second power supply terminal 11, the base of the transistor $Q_{40}$ is in the floating condition, so that the NAND circuits $G_{12}$ to $G_{15}$ become inactivated. On the contrary, if the power supply is effected, at the output $G_0''$ appears an output signal of either logic-1 or logic-0 depending upon the signals applied to the two input terminals $G_{i1}''$ and $G_{i2}''$.

It is to be noted that in FIGS. 6a to 6c, the power supply from the PS 6 is supplied to the first stage transistors in the NAND circuits $G_0$ to $G_{15}$, and this is for the purpose of enhancing the operation speeds of these NAND circuits. More particularly, in each NAND circuit the transistors supplied with electric power from the power supply terminal 8 are always in an operable condition even when electric power is not supplied to the second power supply terminal 11, so that if electric power is supplied from the PS 6 to the second power supply terminal 11, the NAND circuits $G_0$ to $G_{15}$ are immediately activated, that is, the ADD 1 and row selection DD $2_1$ are brought to an activated condition immediately. Consequently, as soon as the PD 9 is activated, a desired memory element can be selected immediately by the address signal. If the operation speed is not taken into consideration, then of course the power supply to all the transistors could be effected from the second power supply terminal 11 to which the output of the PS 6 is applied.

As described above, according to the present invention, a novel P-ROM having lesser number of terminals and a power-down mode can be provided, in which even if a terminal for chip selection and a terminal for the power-down mode are provided in common for the purpose of increasing a memory capacity and decreasing the number of terminals, programming is possible. Moreover, this novel P-ROM has low power consumption and a high operation speed.

In essence, the present invention is characterized in that a detector circuit for detecting the programming electric power applied to the output terminals $O_1$–$O_j$ is provided, and by its detecting output, the peripheral circuits such as the ADD 1 and DD 2 necessitated for selecting a memory element to program are activated. Therefore, the present invention should not be limited to the above-described embodiment but various changes and modifications could be made thereto without departing from the spirit of the present invention. For example, instead of inactivating the ADD 1 and DD 2 by inhibiting the power supply from the PS 6, a circuit connected to the chip-enable terminals $Ce_1$–$Ce_n$ can be provided in which by the application of an unselection level signal, the NAND circuits $G_0$ to $G_{15}$ within the ADD 1 and DD 2 as shown in FIGS. 6a to 6c are inactivated. In such modification, it is only necessary to inactivate the aforementioned circuit by the detection output of the PD 9. Or else, instead of applying the output of the PD6 to the ADD 1 and DD 2, electric power may be supplied from the power supply terminal 8 to these peripheral circuits via gate circuits adapted to be opened by the application of an unselection signal level. The gate circuits close their gates by the detecting output from the PD 9, so that the electric power is applied to peripheral circuits. In this case, the PS 6 is kept inactivated even if the detecting output of the PD 9 is applied thereto, and hence the power supply to the OC 5 is not effected. Moreover, power supply control circuits controlled by the CE 7 could be separately provided for the ADD 1 and DD 2, and these power supply control circuits may be forcibly activated by the detection output of the PD 9.

As another example of a modification to the illustrated embodiment, the base bias voltage for the transistor $Q_{26}$ in the PD 9 could be obtained from a divided voltage produced by dividing the voltage at the power supply terminal 8 with serially connected resistors, or it could be derived from a predetermined junction point of a plurality of serially connected diodes which are connected to the power supply terminal 8. Of course, the current drawn by the PD 9 can be adjusted if desired. In addition, while the logic-1 level at the chip-enable terminals $Ce_1$–$Ce_n$ was chosen as an unselection level, a circuit construction employing the opposite logic levels could be equally realized. Furthermore, the peripheral circuits such as the ADD 1 and DD 2 could have different circuit constructions, and if the number of memory elements in the MC 3 is increased, then circuit constructions adapted to select the corresponding numbers of row lines and column lines could be employed. In the OC 5', while a tri-state output was employed by connecting the resistor $R_{11}$, transistor $Q_{11}$ and diode $D_{14}$ to the collector of the transistor $Q_{12}$, it could be modified into an open-collector output by removing these circuit elements and connecting only the collector of the transistor $Q_{12}$ directly to the output terminal $Q_1$. As a matter of course, in the case of a fuse type P-ROM also, a large capacity P-ROM having a reduced number of terminals and a power-down mode can be equally provided by employing a detector circuit for detecting the application of programming electric power to an output terminal.

What is claimed is:

1. A memory device comprising electrically programmable memory elements, a selection circuit for selecting one of said memory elements, an output circuit having an output terminal for outputting information from the selected memory element, said memory device being of the type in which a selected memory element may be programmed by the application of a programming signal to said output terminal, the inprovement comprising:

detection means for detecting an application of said programming signal to said output terminal, and activation means responsive to a detection output of said detection means indicating detection of said programming signal for activating said selection circuit without activating said output circuit.

2. A memory device according to claim 1, wherein said activation means includes a power supply control circuit for supplying electric power to said selection circuit when activated, and said power supply control circuit is activated in response to said detection output of said detection means.

3. A memory device according to claim 1, wherein said activation means activates said selection circuit by effecting power supply to said selection circuit in response to the detection output of said detention means.

4. A memory device comprising a signal input terminal, a memory section including a plurality of memory elements, a selection circuit section for selecting a predetermined one of said memory elements, an output circuit having an output terminal for reading out information from said selected memory element, means for activating and inactivating said output circuit in response to a signal applied to said signal input terminal, power supply control means for controllably supplying an electric power to said selection circuit section when activated, said power supply control means being adapted to be inactivated when said output circuit is inactivated, and a write circuit for applying a write signal supplied from said output terminal to said memory section for programming a memory element selected by said selection circuit section, the improvement comprising:

detection means for detecting said write signal at said output terminal, and activation means for activating said power supply control means in response to a detection output of said detection means indicating the detection of said write signal while said output circuit is kept inactivated.

5. A memory device according to claim 4, wherein said detection means includes:

a first transistor of one conductivity type having an emitter, base and collector, said emitter being connected to said output terminal, a second transistor of the opposite conductivity type having an emitter, base and collector, said second transistor collector and base being connected respectively to said base and collector of said first transistor, and a diode connected between the collector and base of said second transistor.

6. A memory device comprising a plurality of memory elements, a selection circuit for selecting said memory elements, means for inactivating said selection circuit, and an output terminal for providing output signals representing information stored in said memory elements, said output signals having at least two possible levels, the improvement comprising:

detection means coupled to said output terminal for detecting at said output terminal a signal having a level different from either of said two possible levels and for generating a detection means output signal in response to the detection of said signal having a level different from either of said two possible levels, and activating means responsive to said detection means output signal for activating said selection circuit.

7. A memory device according to claim 6, wherein said memory device includes at least one enabling terminal and an output circuit for driving said output terminal in accordance with information stored in said memory elements, and wherein said inactivating means inactivates both said selection circuit and said output circuit in response to said unselect signal at said enabling terminal, said activating means being responsive to said detection means for activating said selection circuit even during the presence of said unselect signal at said enabling terminal.

8. A memory device according to claim 7, wherein said output circuit remains inactivated when said selection circuit is activated by said activating means during the presence of said unselect signal.

9. A memory device according to claim 8, said memory device being of the type having means for programming selected memory elements in response to the application of a programming signal to said output terminal, said activating means activating said selection circuit in response to the detection of said programming signal at said output terminal.

10. A memory device according to claim 7, including a plurality of enabling terminals and a plurality of output circuits and corresponding output terminals, all of said output circuits being inactivated in response to an unselect signal at any one of said enabling terminals, said selection circuit being activated by said activating means in response to detection of said different level signal at any one of said output terminals.

* * * * *

UNITED STATES PATENT AND TRADEMARK OFFICE
CERTIFICATE OF CORRECTION

PATENT NO. :  4,387,449
DATED      :  June 7, 1983
INVENTOR(S) : Hajime Masuda

It is certified that error appears in the above-identified patent and that said Letters Patent is hereby corrected as shown below:

Column 1, lines 14, 15, "michrome" should be --nichrome--.

Column 2, line 7, delete "of a".

Column 5, line 54, "ines" should be --lines--.

Column 7, line 1, after "column" insert --line--.

line 14, "with" should be --within--.

Column 21, line 55, before "lesser" insert --a--.

Signed and Sealed this

Third Day of July 1984

[SEAL]

Attest:

GERALD J. MOSSINGHOFF

Attesting Officer

Commissioner of Patents and Trademarks